United States Patent
Blanchard et al.

(10) Patent No.: US 11,699,746 B2
(45) Date of Patent: *Jul. 11, 2023

(54) RUGGEDIZED SYMMETRICALLY BIDIRECTIONAL BIPOLAR POWER TRANSISTOR

(71) Applicant: IDEAL POWER INC., Austin, TX (US)

(72) Inventors: Richard A. Blanchard, Los Altos, CA (US); William C. Alexander, Spicewood, TX (US)

(73) Assignee: IDEAL POWER INC., Austin, TX (US)

( * ) Notice: Subject to any disclaimer, the term of this patent is extended or adjusted under 35 U.S.C. 154(b) by 53 days.

This patent is subject to a terminal disclaimer.

(21) Appl. No.: 17/350,254

(22) Filed: Jun. 17, 2021

(65) Prior Publication Data

US 2021/0313461 A1 Oct. 7, 2021

Related U.S. Application Data

(63) Continuation of application No. 15/604,822, filed on May 25, 2017, now Pat. No. 11,069,797.
(Continued)

(51) Int. Cl.
*H01L 29/747* (2006.01)
*H01L 29/74* (2006.01)
*H01L 29/06* (2006.01)
*H01L 29/40* (2006.01)
*H01L 29/66* (2006.01)
(Continued)

(52) U.S. Cl.
CPC ........ *H01L 29/747* (2013.01); *H01L 29/0623* (2013.01); *H01L 29/0696* (2013.01); *H01L 29/404* (2013.01); *H01L 29/407* (2013.01); *H01L 29/408* (2013.01); *H01L 29/66386* (2013.01); *H01L 29/73* (2013.01); *H01L 29/7424* (2013.01); *H01L 29/16* (2013.01)

(58) Field of Classification Search
CPC ............... H01L 29/747; H01L 29/0623; H01L 29/0696; H01L 29/404; H01L 29/407; H01L 29/408; H01L 29/66386; H01L 29/73; H01L 29/7424; H01L 29/16
See application file for complete search history.

(56) References Cited

U.S. PATENT DOCUMENTS

| 7,709,930 B2 | 5/2010 | Stricker et al. | |
| 2005/0151223 A1* | 7/2005 | Voldman | H01L 27/0255 257/E29.328 |
| 2015/0214299 A1* | 7/2015 | Blanchard | H01L 29/0804 257/491 |

* cited by examiner

*Primary Examiner* — Julia Slutsker
(74) *Attorney, Agent, or Firm* — Dickinson Wright PLLC

(57) ABSTRACT

The present application teaches, among other innovations, power semiconductor devices in which breakdown initiation regions, on BOTH sides of a die, are located inside the emitter/collector regions, but laterally spaced away from insulated trenches which surround the emitter/collector regions. Preferably this is part of a symmetrically-bidirectional power device of the "B-TRAN" type. In one advantageous group of embodiments (but not all), the breakdown initiation regions are defined by dopant introduction through the bottom of trench portions which lie within the emitter/collector region. In one group of embodiments (but not all), these can advantageously be separated trench portions which are not continuous with the trench(es) surrounding the emitter/collector region(s).

17 Claims, 11 Drawing Sheets

Related U.S. Application Data

(60) Provisional application No. 62/486,290, filed on Apr. 17, 2017, provisional application No. 62/433,180, filed on Dec. 12, 2016, provisional application No. 62/341,305, filed on May 25, 2016.

(51) Int. Cl.
*H01L 29/73* (2006.01)
*H01L 29/16* (2006.01)

RUGGEDIZED SYMMETRICALLY BIDIRECTIONAL BIPOLAR POWER TRANSISTOR

CROSS-REFERENCE TO RELATED APPLICATIONS

This application is a continuation of U.S. application Ser. No. 15/604,822 filed May 25, 2017 titled "Ruggedized Symmetrically Bidirectional Bipolar Power Transistor," which claims priority from U.S. Provisional App. Nos. 62/341,305, 62/433,180, and 62/486,290. All the noted applications are incorporated by reference herein as if reproduced in full below.

BACKGROUND

The present application relates to semiconductor switching devices which have symmetrically bidirectional operation, and which include bipolar conduction.

Note that the points discussed below may reflect the hindsight gained from the disclosed inventions, and are not necessarily admitted to be prior art.

FIG. 5A shows an example of a bi-directional bipolar transistor or "B-TRAN," and FIG. 5B shows the symbol for such a B-TRAN device. Devices of this type were a radical departure from previous power semiconductor devices. Description of many variants of such devices, and of methods for using them, can be found e.g. in US 2016/0173083, US 2016/0269021, US 2016/0329324, US 2016/0344300, US 2017/0047922, US 2016/0204779, and US 2017/0104478, all of which are hereby incorporated by reference. All of these applications have common ownership with the present application.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION

Ruggedized Symmetrically Bidirectional Bipolar Power Transistor

The present application teaches, among other innovations, power semiconductor devices having breakdown initiation regions, on BOTH sides of a die, which are laterally spaced away from insulated trenches which surround the emitter/collector regions. Preferably this is part of a symmetrically-bidirectional power device of the "B-TRAN" type.

This layout advantageously keeps the inevitable hot carrier generation, which occurs at the start of breakdown, remote from the sensitive oxide interfaces surrounding the emitter/collector, and also from oxide interfaces in the device termination. This prevents degradation of the device when overvoltage breakdown has occurred.

In one advantageous group of embodiments (but not all), the breakdown initiation regions are defined by dopant introduction through the bottom of trench portions which lie within the emitter/collector region. In one group of embodiments (but not all), these can advantageously be separated trench portions which are not continuous with the trench(es) surrounding the emitter/collector region(s).

The numerous innovative teachings of the present application will be described with particular reference to presently preferred embodiments (by way of example, and not of limitation). The present application describes several inventions, and none of the statements below should be taken as limiting the claims generally.

The present application discloses new approaches to increasing the ruggedness of Bi-Directional Bipolar Transistors—especially, but not only, double-base-contact devices of the B-TRAN family.

Figure 2:
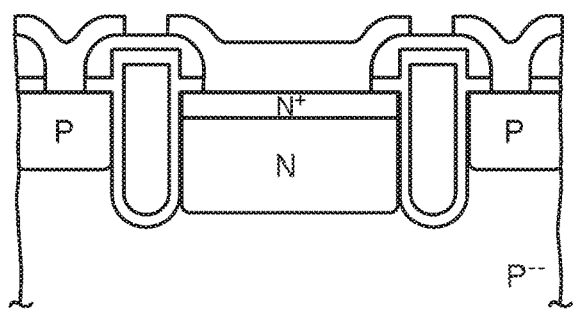
FIG. 2 shows a cross section of the emitter/collector region of one example of an NPN B-TRAN with adjacent base contact regions.

Consider the performance of B-TRANs when a high reverse voltage is applied to one of the two base/collector junctions. When a voltage greater than about a volt is applied between the two emitter/collector terminals, there is a reverse voltage across one of the two junctions between the terminals. (The reverse-biased junction is referred to as the "base-to-collector" junction throughout the present document.) FIG. 2 shows a single collector region and two base contact regions, one on each side of the collector region. As the voltage across the reverse biased base-to-collector region is increased, the electric field that is present also increases. At some voltage, the critical electric field is reached at some location in the B-TRAN structure, and current begins to flow through the device. There are several regions in the B-TRAN where this current flow may begin.

1. If this current flow occurs at the edge of the die, which is often referred to as the "termination" region, charged carriers may be injected into the dielectric layer above the semiconductor material in the termination region, permanently reducing the voltage that the termination can sustain, or even destroying the device.

2. If this current flow occurs at the base-to-collector junction close to the trench that surrounds the collector region, charged carriers may be injected into the silicon dioxide layer that covers the interior of the trench, permanently reducing the voltage that the base-to-collector junction can sustain, or destroying the device.

What is needed is a technique for directing the current flow that results from an overvoltage event through regions of the B-TRAN that are not damaged by this current flow. As seen in FIG. 2, the regions of the B-TRAN that are the furthest from both the termination and the silicon dioxide lined trench are at the center of the collector regions, approximately half way between the trenches. In addition to needing a structure that causes the current to flow in the center region, this structure has little, if any, effect on other device characteristics such as current density and current gain. This localized behavior can be achieved, for example, by adding dopant atoms in or near the base-to-collector junction at the center of the collector region, thereby increasing the local electric field and causing the breakdown to occur at a lower voltage at this location.

Figure 3A:
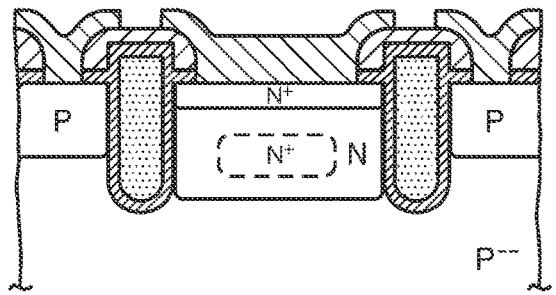
FIGS. 3A-4B show several examples of ruggedized NPN B-TRAN structures, with emitter/collector doping profiles that result in device breakdown at the center of the base-to-emitter junction.
Figure 3B:
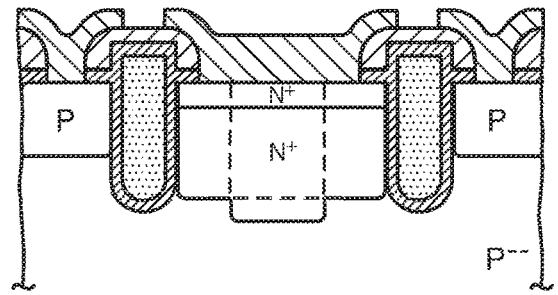

The following techniques can be used for achieving this improved device performance. 1. Modify the doping profile in the emitter/collector regions on each surface by introducing additional n-type dopant. This additional n-type dopant may be added so either the boundaries of the emitter/collector regions are not changed, or so the boundaries of the emitter/collector regions are increased. These two variations are shown in FIGS. 3A and 3B for the emitter/collector region on one side of a B-TRAN. This technique has the following characteristics:

a. The additional n-type doping concentration may increase the emitter injection efficiency, resulting in better device performance.

b. The n-type dopant profile used to produce the desired breakdown voltage may be obtained by introducing the dopant using commonly available processing steps.

c. The availability of arsenic and phosphorus, both of which are n-type dopant atoms having different diffusion coefficients, provides the opportunity to obtain collector dopant profile having a deep phosphorus portion that contains a shallower, but more heavily doped arsenic region. (Since the present B-TRAN process flow uses both arsenic and phosphorus to form the emitters, it may be possible to modify the details of the implants and the diffusions to obtain the desired device characteristics, while keeping the process sequence the same.)

Figure 4A:
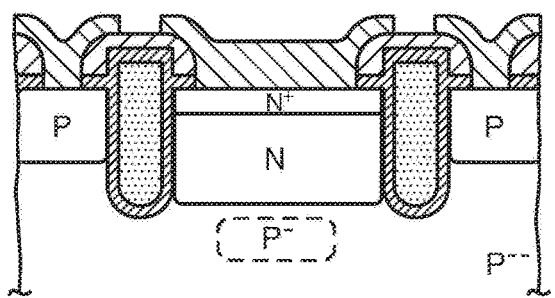
Figure 4B:
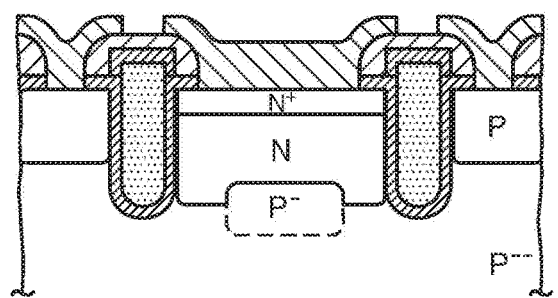
Figure 5A:
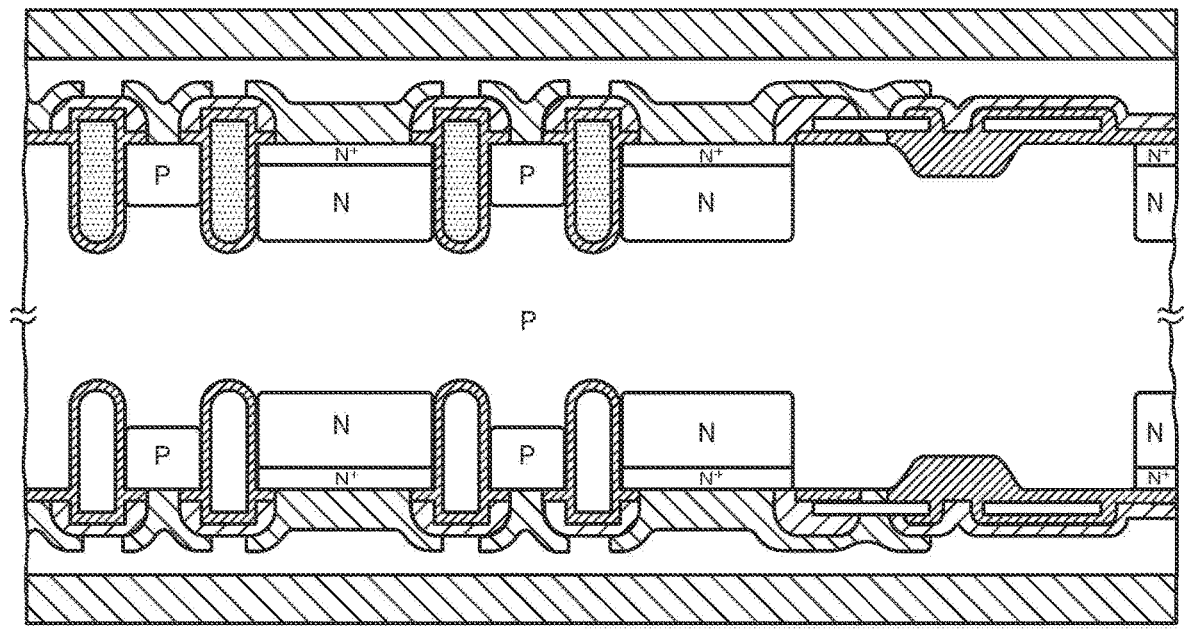
FIG. 5A shows an example of a bi-directional bipolar transistor or "B-TRAN.
Figure 5B:
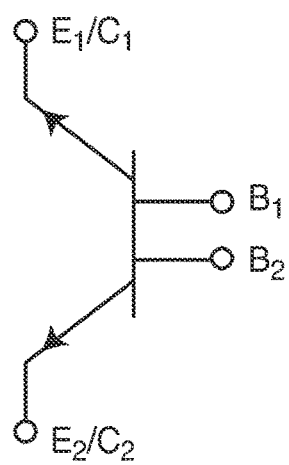
" and FIG. 5B shows the symbol for such a B-TRAN device.

2. Modify the doping profile of the base region below each of the emitter/collector regions by introducing additional p-type dopant. This additional p-type dopant can be added so either the boundaries of the base region are not changed, or so the boundaries of base region are increased. These two variations are shown in FIGS. 4A and 4B for the base region on one side of a B-TRAN. This technique has the following characteristics:

a. The presence of a higher boron doping concentration below the center of the emitter may decrease the emitter injection efficiency.

b. The p-type dopant profile used to produce the desired breakdown voltage may be obtained using an additional epitaxial deposition or by introducing boron using a high energy implanter.

While both techniques steer the breakdown current away from sensitive regions of the B-TRAN, the techniques of FIGS. 3A-3B can result in higher current gain, and are also more easily implemented.

The requirements that the structures on the two sides of the B-TRAN should be very similar places significant restrictions on the B-TRAN process sequence. However, these same process restrictions exist when incorporating the structures that increase device ruggedness as described in the present specification.

FIGS. 3A and 3B show B-TRAN structures with emitter/collector doping profiles that result in device breakdown at the center of the base-to-emitter junction. FIG. 3A shows an example of how addition of n-type dopant increases the field at the center of an emitter area without changing the boundary. FIG. 3B shows an example of how addition of n-type dopant increases the field at the center of an emitter area while changing the boundary.

FIGS. 4A and 4B show further B-TRAN structures with emitter/collector doping profiles that result in device breakdown at the center of the base-to-emitter junction. FIG. 4A shows an example of how addition of p-type dopant increases the field at the center of an emitter area without changing the boundary. FIG. 4B shows an example of how addition of p-type dopant increases the field at the center of an emitter area while changing the boundary.

Techniques that were discussed for obtaining the buried structures of FIGS. 3A-4B include, for example, high energy ion implantation, or dopant introduction at the substrate surface followed by epitaxial silicon growth. In both instances, the breakdown voltage of the device is decreased, with the actual avalanche breakdown occurring at the location where the additional dopant atoms were introduced.

Figure 1:
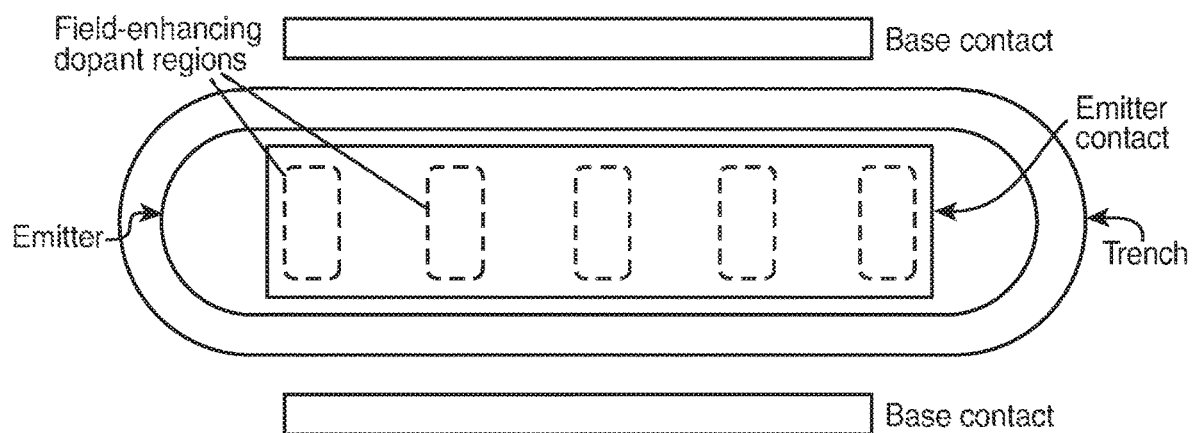
FIG. 1 shows a plan view of one surface of a ruggedized B-TRAN device, in which breakdown initiation regions have been added to the interior of the emitter/collector regions(s) with lateral spacing from the trench structure at the edge.

FIG. 1 is a plan view of one example of a B-TRAN layout, showing the placement of the field-enhancing dopant regions to produce initiation locations inside the active device array. These initiation locations will have a slightly lower breakdown voltage than edge portions of the emitter/collector structure, and hence overvoltage breakdown will initiate here. Hot carriers which may be generated at initial breakdown will therefore be located in these initiation locations, which are spaced away from the insulated trench at the edge of the emitter/collector structure. This avoids hot-carrier-induced degradation of the field-modifying effects of the field plate structure.

Figure 6:
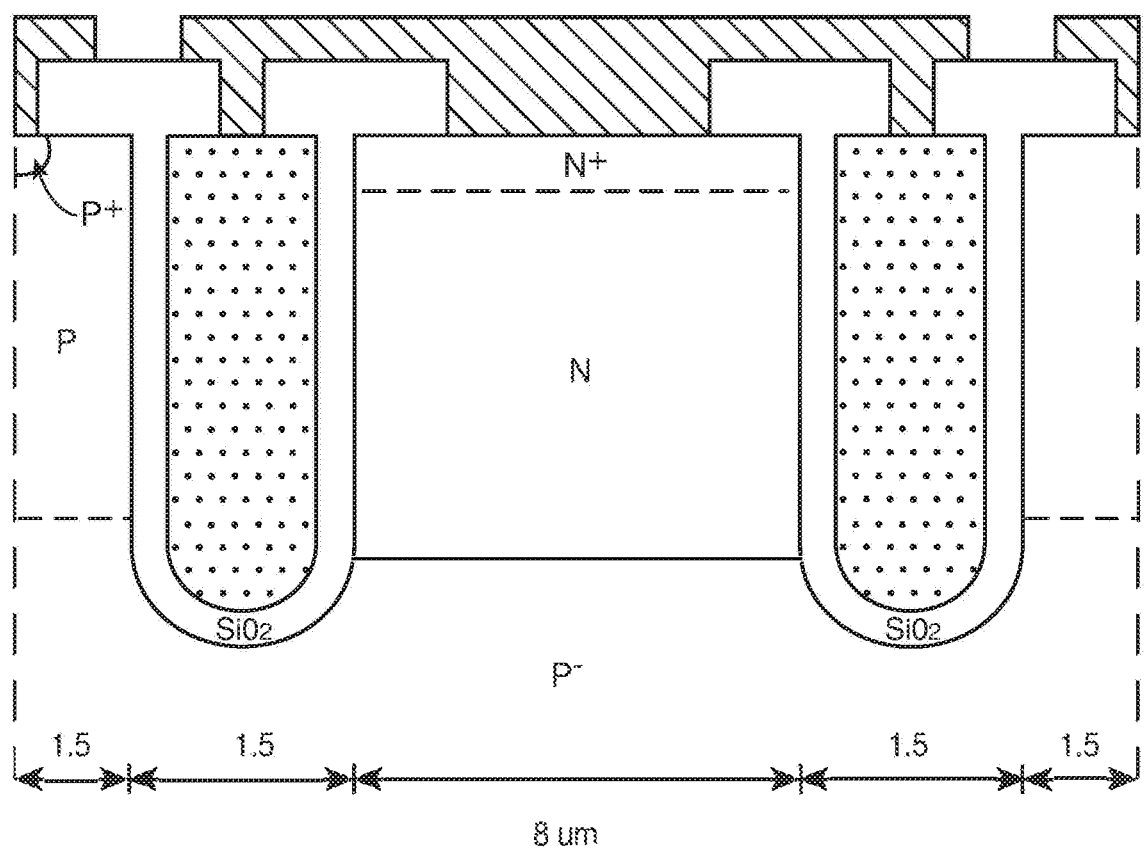
FIG. 6 shows a cross section of a single cell of a conventional B-TRAN.

A cross section of an example of a single cell of a conventional B-TRAN is shown in FIG. 6. The n-type emitter/collector region is surrounded by an oval trench that contains a vertical field plate of doped poly silicon (which typically is electrically connected to the emitter/collector region). The trench, in this example, has a depth of 4-6 microns, which is sufficient to provide a cell breakdown voltage close to the breakdown voltage of a plane junction. (A B-TRAN structure with a trench that is too shallow has a breakdown voltage that is too low, while a trench that is deeper than 4-6 microns takes longer to etch without any increase in breakdown voltage.)

Figure 7:
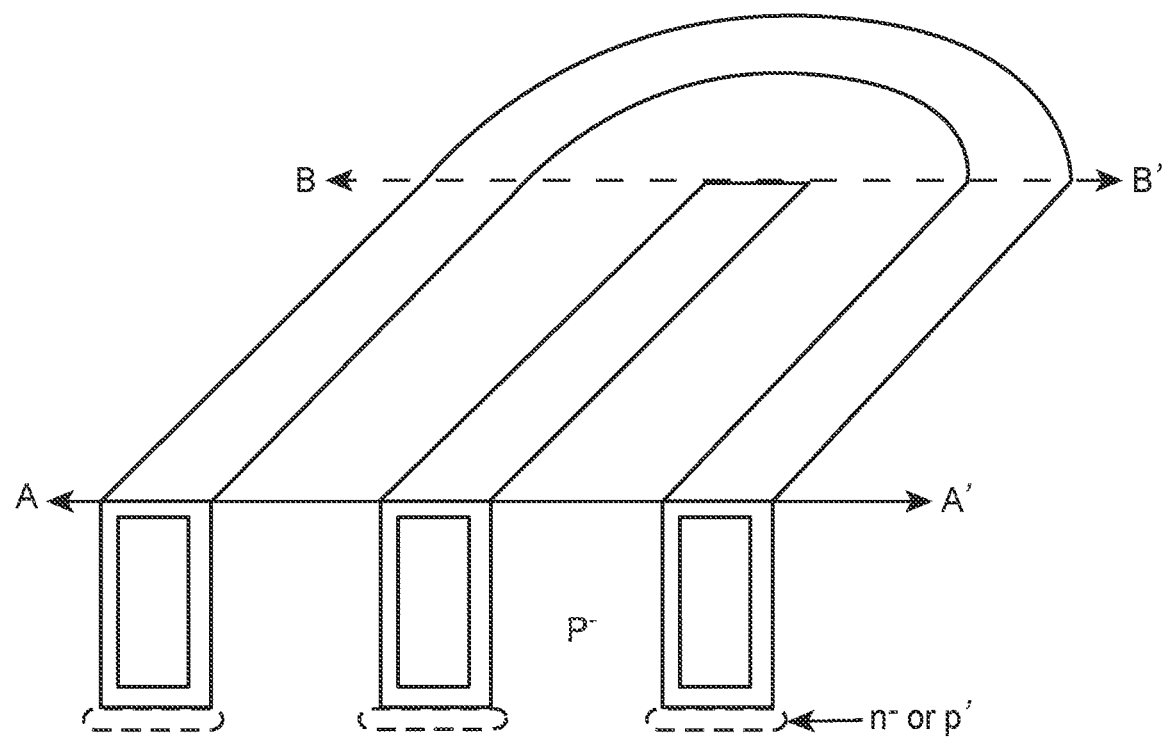
FIG. 7 shows both the cross section and part of the top of a B-TRAN cell with a trench along its center.

FIG. 7 shows both the cross section and part of the top of a B-TRAN cell with a trench along its center. Dopant atoms have been introduced below the bottom of the trench forming the vertical field plate, as well as below the bottom of the trench in the center of the cell. To avoid problems with etching that can occur when two trenches intersect, the center trench ends before it encounters the trench with the vertical field plate. The center trench is shown as having the same width as the trench with the vertical field plate, but they do not need to be the same. The width of the center trench can be smaller, as long as the trench depth is not decreased. A narrower center trench leaves a greater percentage of the emitter region available to inject carriers. The dopant that is introduced at the trench bottom may be n-type or p-type, as long as it decreases the breakdown voltage of the B-TRAN locally.

Figure 8:
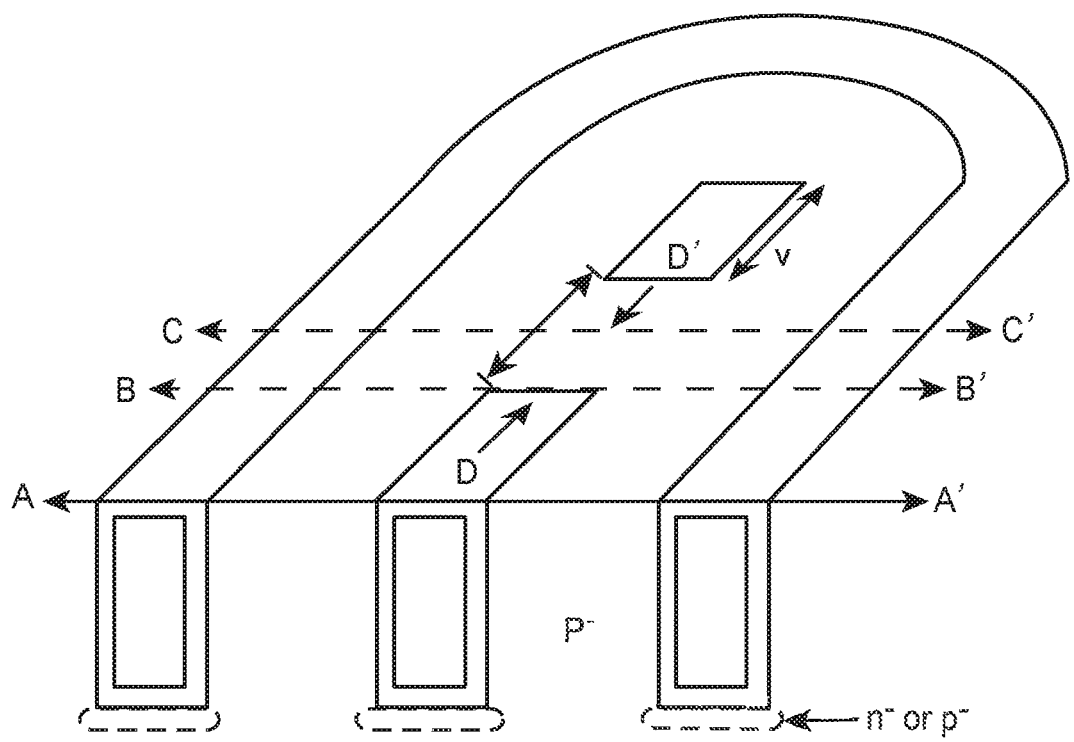
FIG. 8 shows the cross section and part of the top of a B-TRAN cell with a segmented trench at the cell center.

FIG. 8 shows the cross section and part of the top of a B-TRAN cell with a segmented trench at the cell center. The comments concerning the center trench of FIG. 7 also apply to the segmented trench of FIG. 8. The spacing between segments in FIG. 8 is "S," while the segment length is "D." (All of the trench segments need not be the same length, and the trench segments need not be the same distance apart. They are shown this way for ease of drawing. In addition, the presence of trench segments having different lengths and spaces makes both device simulation and layout more difficult.) The values of S and D are selected to provide a balance between emitter injection area and ruggedness.

Figure 9:
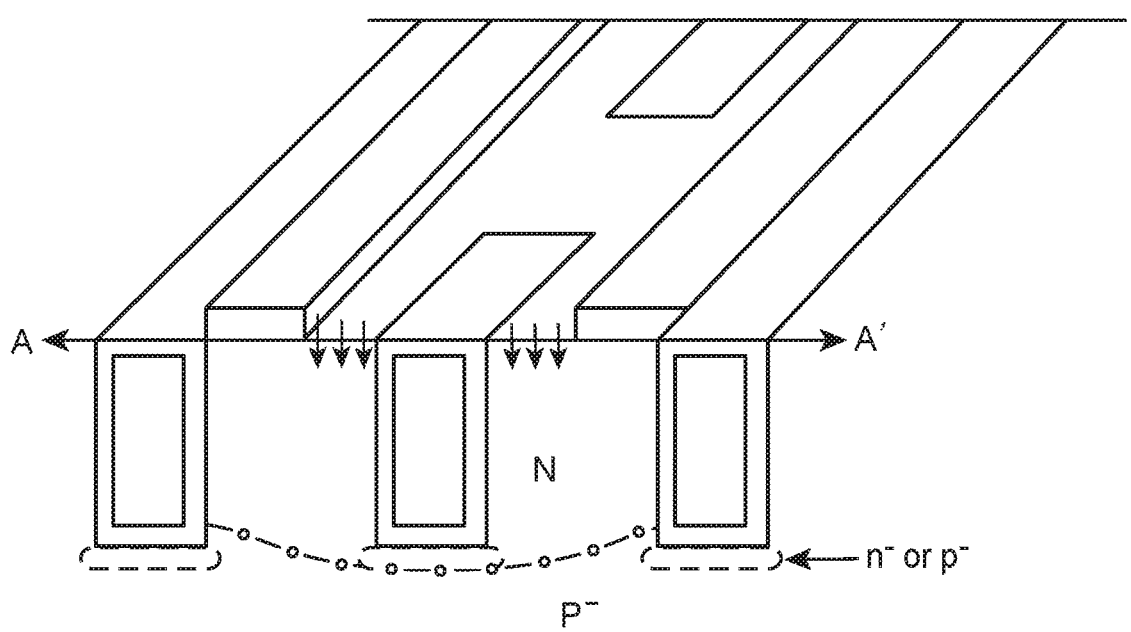
FIG. 9 is a cross section of the cell of FIG. 7 or 8 at A-A'.

FIG. 9 is a cross section of the B-TRAN cell of FIG. 7 or FIG. 8 at A-A' showing the region where emitter dopant atoms are introduced, as well as the resulting n-type doped emitter region. Introducing the n-type emitter dopant atoms only close to the cell center produces an emitter that is deeper in the cell center. In the instance shown in FIG. 9, the emitter-to-base junction overlaps some or all of the dopant at the trench bottom, causing cell breakdown to occur here. However, the emitter-to-base junction does not overlap the doped region at the bottom of the trench containing the vertical field plate, so the breakdown voltage is not decreased in this area. Since the emitter doping profile overlaps just the region at the bottom of the trench at the cell center, the breakdown to occur only in the center of the cell below the center trench.

Figure 10:
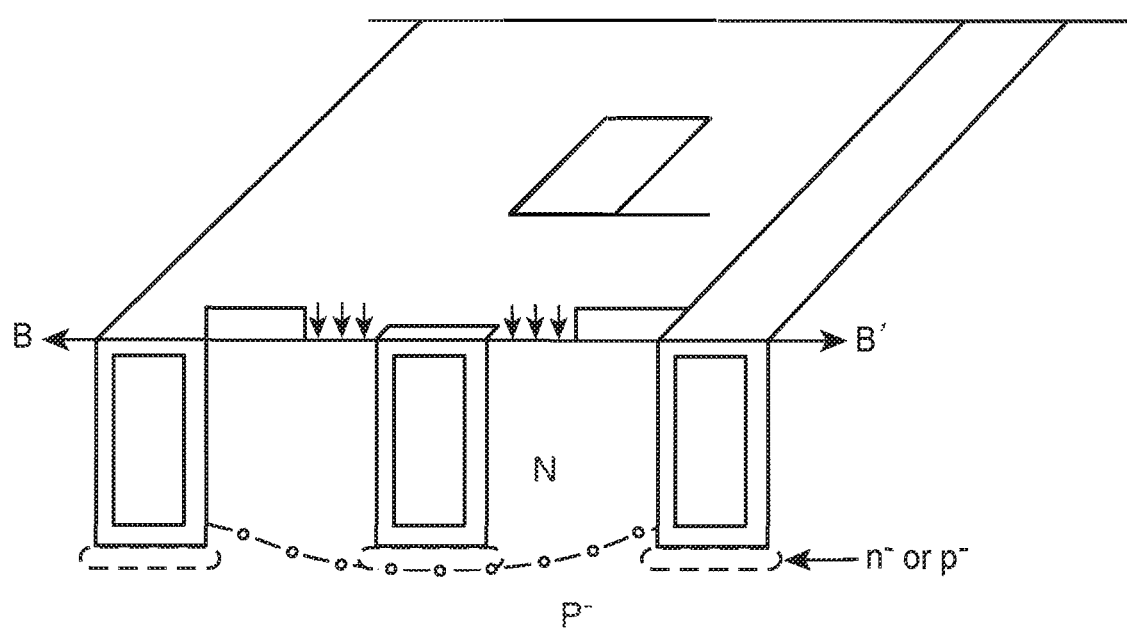
FIG. 10 is a cross section of the cell of FIG. 7 or FIG. 8 at B-B'.

FIG. 10 is a cross section of the B-TRAN cell of FIG. 7 or FIG. 8 at B-B' showing the region at the end of the trench where the emitter dopant atoms are introduced and the resulting n-type doped emitter region. In this instance, n-type emitter atoms are introduced into the entire region between segments of the trench. The emitter-to-base junction also overlaps the region where dopant atoms were introduced at the bottom of the center trench, causing a lower breakdown voltage. Also, as discussed for FIG. 9, the emitter-to-base junction does not overlap the dopant below the trenches with the vertical field plate, so no decrease in breakdown voltage occurs there.

Figure 11:
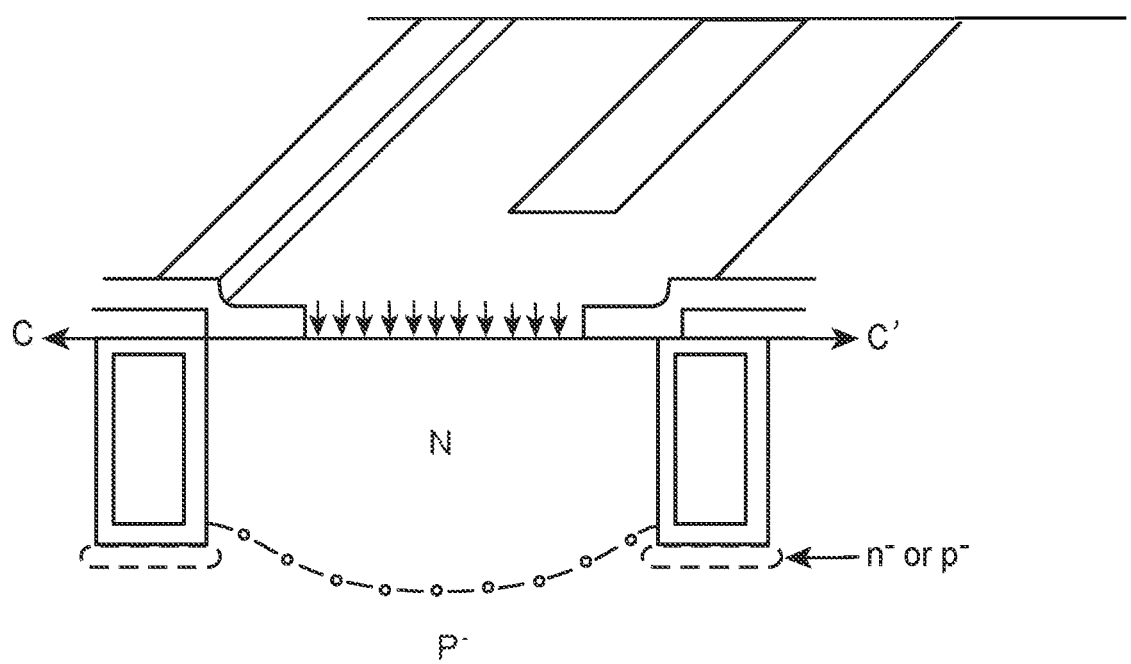
FIG. 11 is a cross section of the cell of FIG. 8 at C-C'.

FIG. 11 is a cross section of the B-TRAN cell of FIG. 8 at C-C'. The emitter atoms are introduced in just the center of the cell, resulting in the emitter-to-base junction that is shown. The absence of any overlap between the doped emitter region and the dopant atoms at the trenches forming the vertical field plate around the emitter means that the breakdown voltage is not decreased in this location.

Figure 12:
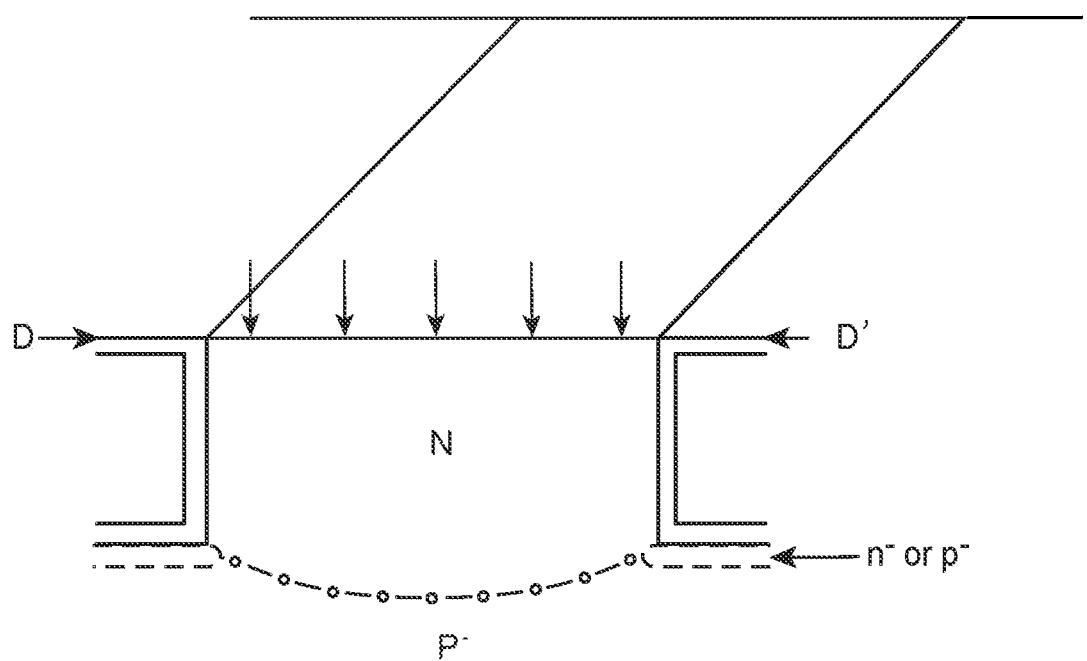
FIG. 12 is a cross section of the cell of FIG. 8 at D-D'.

FIG. 12 is a cross section of the B-TRAN cell of FIG. 8 at D-D'.

Figure 13:
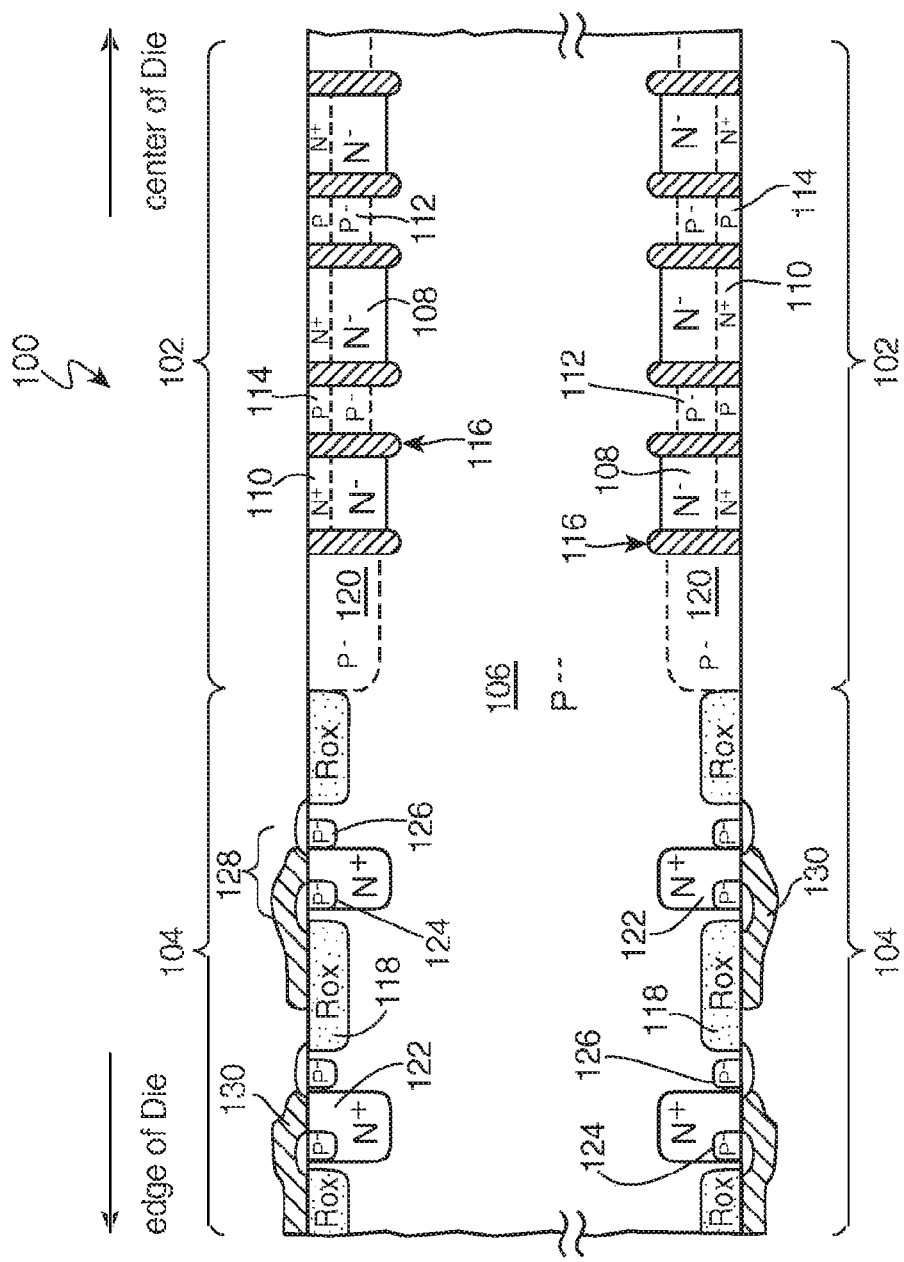
FIG. 13 shows an example of a termination structure which can advantageously be used in combination with the breakdown initiation region of FIG. 1.

FIG. 13 shows an example of a termination structure which can advantageously be used in combination with the breakdown initiation region of FIG. 1. The active regions 102 on both sides of the B-TRAN 100 include N− emitter regions 108 and N+ emitter contact regions 110. The breakdown initiation regions of FIG. 1 are not separately shown, but are preferably located within the emitter regions 108, and spaced from the insulated trenches 116.

Contact to P− bulk base region 106 is made through base regions 112 and corresponding base contact regions 114, both of which are preferably shallower than emitter regions 108 and emitter contact regions 110, respectively. N-type emitter regions 108 and 110 are most preferably separated from p-type base regions 112 and 114 by poly-filled insulated trenches 116. Poly-filled trenches 116 are most preferably electrically connected to n-type source regions 110.

B-TRANs are fully bidirectional and vertically symmetric: for a given conduction direction, n-type regions 108 on one side of B-TRAN 100 act as emitter regions while those on the opposite side act as collector regions, and vice versa for the opposite direction of conduction.

P-type base contact regions 114 permit low-resistance ohmic contact to P− base regions 112. Similarly, n-type emitter contact regions 110 permit low-resistance ohmic contact to N− emitter regions 108.

P-region 120, which is preferably formed by the same diffusion as P− base regions 112, marks the transition between active region 102 and termination region 104. Termination structure 128 in termination region 104 includes deep N+ field-limiting ring 122 and shallow P− rings 124 and 126.

Each adjacent pair of termination structures 128 is separated by recessed thick field oxide region 118. Metal field plate 130 is electrically connected to deep N+ termination ring 122 and extends outward over a portion of thick field oxide 118, toward the edge of the die. Field plate 130 provides a constant potential above thick oxide region 118. The thickness of field oxide 118 and the distance that field plate 130 extends over field oxide 118 can be adjusted for the device parameters to further increase the breakdown voltage in the termination region.

ADVANTAGES

The disclosed innovations, in various embodiments, provide one or more of at least the following advantages. However, not all of these advantages result from every one of the innovations disclosed, and this list of advantages does not limit the various claimed inventions. In particular, the advantages may include: power semiconductor devices with more ruggedness; power semiconductor devices with higher breakdown voltage; power semiconductor devices with lower on-resistance; and/or power semiconductor devices with lower cost.

According to some but not necessarily all embodiments, there is provided: A semiconductor device, comprising, on BOTH surfaces of a first-conductivity-type semiconductor die: a second-conductivity-type emitter/collector region, laterally surrounded by an insulated trench; and a first-conductivity-type base contact region, laterally separated from the emitter/collector region by the insulated trench, and making ohmic contact to the bulk of the semiconductor die; wherein the emitter/collector region includes, in the interior thereof at locations separated from the insulated trench, breakdown initiation regions where an additional dose of dopant causes a slightly reduced breakdown voltage; whereby breakdown, under overvoltage conditions, begins near the initiation regions, and thereby minimizes hot carrier injection into the insulated trench.

According to some but not necessarily all embodiments, there is provided: A semiconductor device, comprising, on BOTH surfaces of a first-conductivity-type semiconductor die: a second-conductivity-type emitter/collector region, surrounded by an insulated trench having a conductive electrode therein; and a first-conductivity-type base contact region, laterally separated from the emitter/collector region by the insulated trench, and making ohmic contact to the bulk of the semiconductor die; wherein the emitter/collector region includes, in the interior thereof at locations separated from the insulated trench, breakdown initiation regions where an additional dose of dopant causes a slightly reduced breakdown voltage; whereby breakdown, under overvoltage conditions, begins near the initiation regions, and thereby minimizes hot carrier injection into the insulated trench.

According to some but not necessarily all embodiments, there is provided: A semiconductor device, comprising, on BOTH surfaces of a first-conductivity-type semiconductor die: an active device area which includes a second-conductivity-type emitter/collector region, laterally surrounded by an insulated trench having a conductive electrode therein; and a first-conductivity-type base contact region, laterally separated from the emitter/collector region by the insulated trench, and making ohmic contact to the bulk of the semiconductor die; wherein the emitter/collector region includes, in the interior thereof at locations separated from the insulated trench, breakdown initiation regions where an additional dose of dopant causes a slightly reduced breakdown voltage; a termination region which surrounds the active device area, and which includes semiconductor-oxide interface locations; whereby breakdown, under overvoltage conditions, begins near the initiation regions, and thereby minimizes hot carrier injection into the insulated trench, while also avoiding hot carrier injection at the semiconductor-oxide interface locations.

According to some but not necessarily all embodiments, there is provided: A semiconductor device, comprising, on BOTH surfaces of a first-conductivity-type semiconductor die: a second-conductivity-type emitter/collector region, surrounded by an insulated trench having a conductive electrode therein; and a first-conductivity-type base contact region, laterally separated from the emitter/collector region by the insulated trench, and making ohmic contact to the bulk of the semiconductor die; wherein the emitter/collector region includes, in the interior thereof at locations separated from the insulated trench, breakdown initiation regions where an additional dose of dopant causes a slightly reduced breakdown voltage; whereby breakdown, under overvoltage conditions, begins near the initiation regions, and thereby minimizes hot carrier injection into the insulated trench.

According to some but not necessarily all embodiments, there is provided: A method for fabricating a semiconductor device, comprising: forming, on BOTH surfaces of a first-conductivity-type semiconductor die: a second-conductivity-type emitter/collector region, surrounded by an insulated trench having a conductive electrode therein; and a first-conductivity-type base contact region, laterally separated from the emitter/collector region by the insulated trench, and making ohmic contact to the bulk of the semiconductor die; wherein the emitter/collector region includes, in the interior thereof at locations separated from the insulated trench, breakdown initiation regions where an additional dose of dopant causes a slightly reduced breakdown voltage; whereby breakdown, under overvoltage conditions, begins near the initiation regions, and thereby minimizes hot carrier injection into the insulated trench.

According to some but not necessarily all embodiments, there is provided: The present application teaches, among other innovations, power semiconductor devices in which breakdown initiation regions, on BOTH sides of a die, are located inside the emitter/collector regions, but laterally spaced away from insulated trenches which surround the emitter/collector regions. Preferably this is part of a symmetrically-bidirectional power device of the "B-TRAN" type.

APPENDIX

A set of simulation results, including color graphics, is being filed herewith. These simulation results are not necessary for understanding the inventions, but help to corroborate the asserted advantages and to illustrate optional alternatives. All of this material is hereby incorporated by reference.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims. As shown in the figures and discussed in the text, the addition of dopant atoms at the bottom of one or more trenches located in the center of the B-TRAN cell results in a lower breakdown voltage at the bottom of the trench or trenches. Choice of the center trench width, whether to use a single long trench or a segmented geometry with a number of smaller trenches, and the dimensions of the trench or trenches, provides a range in the ratio between the emitter area that injects carriers and the area where emitter-to-base breakdown occurs. This ratio can be adjusted for the desired device level of performance. In addition, the center trench may be left floating electrically, or may be connected to the emitter region.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device, comprising, on both surfaces of a first-conductivity-type semiconductor die:
    an emitter/collector region of second-conductivity-type, laterally surrounded by a first insulated trench, a portion of the emitter/collector region has a first breakdown voltage;
    a base contact region of first-conductivity-type, the base contact region laterally separated from the emitter/collector region by the first insulated trench, and making ohmic contact to a bulk of the semiconductor die; and
    a breakdown initiation region disposed at least partially in an interior of the emitter/collector region at a non-zero distance from sides of the first insulated trench, the breakdown initiation region comprising additional second-conductivity-type dopant atoms compared to adjacent regions of second-conductivity-type dopant of the emitter/collector region, and the breakdown initiation region has a second breakdown voltage lower than the first breakdown voltage.

2. The semiconductor device of claim 1, wherein the first-conductivity type is p-type.

3. The semiconductor device of claim 1, wherein the second breakdown voltage between the emitter/collector regions on both surfaces of the device is more than 1000V.

4. The semiconductor device of claim 1, wherein the semiconductor die is silicon.

5. The semiconductor device of claim 1, wherein the breakdown initiation region contains additional second-conductivity type dopant atoms not present in other portions of the emitter/collector region, thereby creating a region of more heavily doped second-conductivity type dopant having a higher concentration of dopant.

6. The semiconductor device of claim 1, wherein the breakdown initiation region does not change the junction depth of the emitter/collector region.

7. The semiconductor device of claim 1, wherein the emitter/collector region comprises one or more trench segments underlain by an additional dopant component that locally reduces the first breakdown voltage.

8. The semiconductor device of claim 1:
- wherein the first insulated trench comprises a conductive electrode within the first insulated trench; and further comprising
- multiple trench segments underlain by an additional dopant component which locally reduces the first breakdown voltage;
- wherein the multiple trench segments are not continuous with the first insulated trench, and some of the multiple trench segments are continuous with each other.

9. A semiconductor device, comprising, on both surfaces of a first-conductivity-type semiconductor die:
- an emitter/collector region of second-conductivity-type, laterally surrounded by a first insulated trench comprising a conductive electrode therein, a portion of the emitter/collector region has a first breakdown voltage;
- a base contact region of first-conductivity-type, the base contact region laterally separated from the emitter/collector region by the first insulated trench, and making ohmic contact to a bulk of the semiconductor die; and
- a breakdown initiation region disposed at least partially in an interior of the emitter/collector region at a non-zero distance from sides of the first insulated trench, the breakdown initiation region comprising additional second-conductivity-type dopant atoms compared to adjacent regions of second-conductivity-type dopant of the emitter/collector region, and the breakdown initiation region has a second breakdown voltage lower than the first breakdown voltage.

10. The semiconductor device of claim 9, wherein the second breakdown voltage between the emitter/collector regions on both surfaces of the device is more than 1000V.

11. The semiconductor device of claim 9, wherein the semiconductor die is silicon.

12. The semiconductor device of claim 9, wherein the breakdown initiation region contain additional second-conductivity type dopant atoms not present in other portions of the emitter/collector region, thereby creating a region of more heavily doped second-conductivity type dopant having a higher concentration of dopant and exhibiting lower breakdown voltage compared to adjacent regions of second-conductivity-type dopant.

13. The semiconductor device of claim 9, wherein the breakdown initiation region does not change the junction depth of the emitter/collector region.

14. The semiconductor device of claim 9, wherein the conductive electrode is electrically connected to the emitter/collector region.

15. The semiconductor device of claim 9 further comprising:
- a second insulated trench; and
- an additional dopant component below the second insulated trench that locally reduces the first breakdown voltage.

16. The semiconductor device of claim 9, further comprising:
- a second insulated trench comprising multiple segments which are not continuous with the first insulated trench, and are also not continuous with each other, and the second insulated trench laterally surrounded by the emitter/collector region; and
- an additional dopant component below the second insulated trench which locally reduces the first breakdown voltage.

17. The semiconductor device of claim 9:
- wherein the first insulated trench comprises a conductive electrode within the first insulated trench; and further comprising
- multiple trench segments underlain by an additional dopant component which locally reduces the breakdown voltage;
- wherein the multiple trench segments are not continuous with the first insulated trench, and some of the multiple trench segments are continuous with each other.

* * * * *